(12) United States Patent
Kumeth

(10) Patent No.: US 6,442,829 B1  
(45) Date of Patent: Sep. 3, 2002

(54) PRODUCTION AND/OR ASSEMBLY APPARATUS

(75) Inventor: Sigmund Kumeth, Kastl (DE)

(73) Assignee: Feintool International Holding, Lyss (CH)

( * ) Notice: Subject to any disclaimer, the term of this patent is extended or adjusted under 35 U.S.C. 154(b) by 0 days.

(21) Appl. No.: 09/253,855

(22) Filed: Feb. 22, 1999

Related U.S. Application Data (63) Continuation of application No. PCT/EP98/03549, filed on Jun. 12, 1998.

(30) Foreign Application Priority Data

| Jun. 21, 1997 | (DE) | 197 26 374 |
| Jul. 2, 1997 | (DE) | 197 28 264 |
| Aug. 5, 1997 | (DE) | 197 33 774 |
| Nov. 11, 1997 | (DE) | 197 49 633 |

(51) Int. Cl.[7] .............. B23B 3/16; B23P 21/00  
(52) U.S. Cl. .............. 29/714; 29/40; 29/41  
(58) Field of Search .............. 29/714, 39, 40, 29/41; 82/162; 198/345.3, 345.1, 793

(56) References Cited

U.S. PATENT DOCUMENTS

| 2,852,966 A | * | 9/1958 | Olson | 82/139 |
| 3,160,038 A | * | 12/1964 | Wood | 82/110 |
| 3,575,072 A | * | 4/1971 | Silver et al. | 82/137 |
| 4,080,854 A | * | 3/1978 | Peterson | 82/158 |
| 4,206,665 A | * | 6/1980 | Schurfeld et al. | 82/158 |
| 4,373,840 A | * | 2/1983 | Miller | 414/225 |
| 4,829,716 A | * | 5/1989 | Ueda et al. | 451/295 |
| 5,063,799 A | * | 11/1991 | Brewer | 82/158 |
| 5,165,204 A | * | 11/1992 | Luedeke et al. | 451/342 |
| 5,256,128 A | * | 10/1993 | Neumann | 414/729 |
| 5,384,991 A | * | 1/1995 | Lee | 451/57 |
| 5,551,795 A | * | 9/1996 | Engibarov | 269/73 |
| 5,885,199 A | * | 3/1999 | Shao | 29/39 |

FOREIGN PATENT DOCUMENTS

DE 41 11 545 A1 10/1992

* cited by examiner

Primary Examiner—P. W. Echols  
Assistant Examiner—Marc Jimenez  
(74) Attorney, Agent, or Firm—Laurence A. Greenberg; Werner H. Stemer; Ralph E. Locher (57) ABSTRACT

A production and/or assembly apparatus for processing workpieces has a stationary frame forming basic unit of the system. A motion device is movably supported on the frame. A plurality of workpiece carriers are moved in an indexed manner relative to processing modules and feeders arranged in a fixed position on the frame. The workpiece carriers and/or the processing modules and/or the feeders are detachably fastenable in their respective positions by fastening devices which have an identical design in each case for the workpiece carriers and/or the processing modules and/or the feeders. The apparatus can be reset or retooled by simply exchanging one or more of the workpiece carriers, one or more of the processing modules, and/or one or more of the feeders. The resetting and retooling thereby does not affect the frame forming the basic unit.

17 Claims, 5 Drawing Sheets

PRODUCTION AND/OR ASSEMBLY APPARATUS

CROSS-REFERENCE TO RELATED APPLICATION

This is a continuation of copending International Application PCT/EP98/03549, filed Jun. 12, 1998, which designated the United States.

BACKGROUND OF THE INVENTION

Field of the Invention

The invention relates to a production and/or assembly apparatus for producing and/or assembling a workpiece. The apparatus comprises a frame and a motion device, on which a plurality of workpiece carriers are arranged. The workpiece carriers are movable in an indexed manner relative to processing modules and feeders that are arranged in a fixed position on the frame.

Such production and/or assembly apparatuses are designed in the form of rotary indexing systems, in which the motion device is a rotary indexing table conveying the workpiece carriers, and also as in-line indexing installations having a corresponding in-line conveying section moving the workpiece carriers. It is used wherever an article is to be produced mechanically in a plurality of production or assembly stages, for example in the manufacture of electrotechnical or electromechanical components and precision workpieces, or even in the pharmaceutical industry as well as in the automobile industry. In these installations, the workpiece is processed (i.e., assembled or produced) continuously. It is thereby taken in an indexed manner to the respective processing modules and feeders, which carry out a working step. corresponding to the processing sequence and respectively feed the component or the like required in accordance with the processing sequence.

The processing modules used here may be, for example, handling devices in the form of pincers or grippers; equally, screwdriving, welding or soldering devices as well as embossing or pressing devices may also be used. The feeder may be, for example, a component-conveying device; equally, it may also be a stacking unit or a punching strip having a corresponding punching device in order to punch the requisite components out of a component strip, which are then to be processed with the processing module. In this case, the installations are constructed and designed solely for producing those workpieces for which they have been conceived; that is to say, all the components are produced in accordance with the working steps to be carried out in each case or in accordance with the parts to be worked. In other words, in each case a separate apparatus has to be provided for different workpieces. Resetting the known installations in the event of a change in the workpiece structure or the like is not possible or is only possible at considerable cost.

For the operator of such installations this means a considerable degree of inflexibility, since, with regard to the workpieces to be produced, he is largely restricted to the available apparatuses and, in the event of a change in the workpieces or the like, has to procure a new apparatus or carry out the resetting at a high investment cost. This also applies in the event that a workpiece is no longer produced and in this respect the installation is no longer operated.

SUMMARY OF THE INVENTION

It is accordingly an object of the invention to provide a processing device, which overcomes the above-mentioned disadvantages of the heretofore-known devices and methods of this general type and which permits quick and simple resetting without considerable expense, so that it is possible, in the event of corresponding changes in the workpiece or in the production sequence or the like, to be able to change over the installation immediately, and it is also to be possible to easily reset an apparatus for the production/assembly of a different, new workpiece.

With the foregoing and other objects in view there is provided, in accordance with the invention, an apparatus for processing a workpiece, comprising:

a frame forming a basic unit and a motion device mounted on the frame;

processing modules and feeders mounted in a fixed relationship to the frame;

a plurality of workpiece carriers disposed on the motion device and being movable in an indexed manner relative to the processing modules and the feeders;

substantially identical fastening devices for interchangeably mounting at least one of the workpiece carriers, the processing modules, and the feeders in a detachable and exchangeable manner so as to render the apparatus resettable by exchanging only a respective one of the workplece carriers, the processing modules, and the feeders at the basic unit formed by the frame.

The objects of the invention are thus satisfied with a production and/or assembly apparatus of the type mentioned at the outset, wherein the workplece carriers and/or the processing modules and/or the feeders, by means of interchangeable fastening devices of identical design in each case for the workpiece carriers and/or the processing modules and/or the feeders, are fastened or fastenable in a detachable and exchangeable manner in such a way that, to reset the apparatus, only the workpiece carrier(s) and/or processing module(s) and/or feeder(s) to be changed have to be exchanged at the frame, which forms a basic unit.

The apparatus according to the invention is of modular construction, consisting of a standardized frame, which is the same for all the apparatuses forms a basic unit, and is appropriately equipped or retrofitted. The components possibly to be changed in the course of the retrofitting can be fastened in an especially advantageous manner to the frame by means of quick-change fastening devices standardized for the respective component. If required, these interchangeable fastening devices are released in the simplest manner, and the new element is inserted and fastened as a result of the standardization of this fastening, whereupon this resetting step is complete. No activities whatsoever are to be carried out on the frame itself. In an especially advantageous manner, the apparatus according to the invention, in both rotary indexing installations and in-line indexing installations, thus permits simple and quick resetting without difficult and complicated resetting work. According to the invention, this system may also be used for the fastening of a processing unit at the processing module and respectively for the fastening of a feeding unit at the feeder, so that these units may also easily be exchanged if required.

In accordance with an added feature of the invention, the workpiece carriers are detachably mounted, and including a processing unit at a respective one of the processing modules and a feeding unit at a respective the feeder, and wherein one of the processing unit and the feeding unit is detachably and interchangeably mounted by one of the identical fastening devices such that the apparatus is retoolable by exchanging only selected ones of the processing units and the feeding units.

In accordance with another feature of the invention, the fastening devices are push-in/latching connectors having a first part disposed on one of the frame and the motion device, and a second part disposed on the workpiece carrier.

In accordance with an additional feature of the invention, the fastening devices are push-in/latching connectors having a first part disposed on one of the processing module and the feeder.

In accordance with a preferred embodiment, the push-in/latching connection is a dovetail connection and/or a self-locking connection.

In other words, it has proved to be advantageous if, according to the invention, the interchangeable fastening devices are designed as a push-in/latching connection having a first part arranged on the frame or respectively the motion device, if need be on the processing module or respectively the feeder, and a second part arranged on the workpiece carrier or respectively the processing module or respectively the feeder, if need be on the processing unit or respectively the feeding unit, in which case a dovetail connection has proved to be especially advantageous here. In an especially advantageous manner, this push-in/latching connection enables the element which is to be exchanged to be removed in the simplest manner by releasing the latching connection and enables the new element to be fastened by simply pushing it in and displacing it until it interlocks. As a result of this design of the fastening device according to the invention, correct positioning is always predetermined. Once the connection has been made, the respective resetting step is complete. In particular, the dovetail connection permits simple and reliable work here. Furthermore, it has proved to be advantageous if the push-in/latching connection is designed as a self-locking connection in order to avoid unintentional release of the connection.

In accordance with a further feature of the invention, the fastening device comprises a latch pin disposed on one of the first and second part and an actuating element for moving the latch pin, and the other of the first and second part has a pin receptacle formed therein. The actuating element is preferably a press bolt manually actuatable against a restoring force, the latch pin being coupled to the press bolt.

In accordance with again another feature of the invention, a bearing pin couples the latch pin to the bearing pin, the bearing pin engages in a guide groove formed in the actuating element.

In an alternative embodiment, there is provided a toggle lever mounted on the actuating element via a bearing pin, the toggle lever having ends mounted respectively on the latch pin and on the one of the first and second parts.

In the simplest design, the latch pin may be designed as the push-in pin having an appropriate engagement section, which, when the parts are pushed one inside the other, is inserted into the corresponding pin receptacle. It is especially advantageous, however, if the actuating element is a press bolt, which is to be actuated manually against a restoring force and on which the latch pin is mounted in a motionally coupled manner. According to the invention, the motional coupling may be realized by means of a bearing pin, which is provided on the latch pin and engages in a guide groove formed on the actuating element. An equally effective and self-locking alternative may provide for the motional coupling to be formed by means of a toggle lever, which is mounted on the actuating element via a bearing pin and whose ends are mounted on the respective part and on the latch pin respectively.

In accordance with again an additional feature of the invention, each fastening device is adapted to fasten a respective element in a plurality of fastening positions.

In accordance with again an added feature of the invention, adjusting means are provided on at least one of the processing modules and the feeders for setting up one of the processing modules, the processing units, the feeders, and the feeding units. The adjusting means are preferably an adjusting spindle for moving the latch receptacle.

In other words, the interchangeable fastening device may be designed in such a way that the respective element to be fastened can be placed in a plurality of fastening positions, for which purpose a corresponding plurality of latch receptacles merely need to be provided. In particular when resetting for new components, this provides more possibilities with regard to the orientation of the same. At the same time, it has proved to be especially expedient if adjusting means for setting up the processing modules and/or their processing units and/or the feeders and/or their feeding units are provided on the processing modules and/or the feeders, these adjusting means advantageously comprising an adjusting spindle for moving the latch receptacle. In this embodiment, the latch receptacle can be moved, as a result of which the entire respective element can be moved relative to the first part on the frame. This is in particular of advantage if only the feeding unit is exchanged at the feeder in order to enable the feeding unit to follow the receiver position in this way, since the receivers are arranged firmly on the feeder, which is not exchanged in this case, and the top part has to be pushed up relative to the receiver position.

In accordance with again a further feature of the invention, a common drive for the processing modules and the feeders is provided, and at least one part of the processing modules and one part of the feeders are detachably connectible to the common drive.

In accordance with a further feature of the invention, a plurality of drive couplings are mounted on the frame and assigned to each of the processing modules and the feeders, the processing modules and the feeders being detachably connected to the common drive via the drive couplings. Preferably, the drive couplings assigned to the feeders are bevel gear units, and the drive couplings assigned to the processing modules comprise a plurality of coupling receptacles movable by the common drive and coupling elements of the processing modules mounted to the coupling receptacles.

In accordance with yet an added feature of the invention, a fixed sensor element detects a presence of the workpiece carriers, and an operation of the processing modules and the feeders is controlled in response to a signal of the sensor element.

In accordance with yet an additional feature of the invention, an electronic control device controls an operation of the apparatus. The control device is programmed to, if a workpiece carrier is detected as being missing, store a position thereof relative to a defined work cycle in memory, and, with each motional cycle, interrupt a working operation of a respective processing module, processing unit, feeder, or feeding unit with regard to a following position in the work cycle.

It has proved to be especially advantageous with regard to a simple construction of the apparatus according to the invention if at least one part of the processing modules and/or one part of the feeders is connected or can be connected in each case in a detachable manner to the common drive for the processing modules and/or the feeders. Of course, as an alternative to this, a separate drive for each component is conceivable, and this drive can be controlled via the electronic control device. In the case of a common drive, provision may be made according to the invention for a plurality of drive couplings assigned to the respective processing modules and feeders respectively and coupled to the drive to be provided on the frame, to which drive couplings the processing modules and the feeders respectively can be detachably connected. In this case, according to the invention, the drive couplings assigned to the feeders may be designed as bevel gear units, to which the feeder is attached in the simplest manner by its corresponding coupling part. In the case of the processing modules, the drive couplings assigned to the processing modules may comprise if need be a plurality of coupling receptacles, which are movable via the drive and in or on which corresponding coupling elements of the processing modules can be secured in position. These coupling receptacles may be, for example, horizontally arranged, undercut coupling rings, which are vertically movable by means of the drive and into which the corresponding coupling elements of the processing modules can be inserted in the simplest manner.

In accordance with yet another feature of the invention, a drive is provided for driving the motion device and a safety coupling disposed in a drive line between the drive and the motion device, the safety coupling, if a given torque is exceeded, disconnecting the motion device from the drive, and including a brake disposed so as to brake the motion device when the safety coupling is disconnected.

In accordance with yet a further feature of the invention, the safety coupling includes a movable part, and a sensor element continuously monitoring a position of the movable part, the sensor element being in control connection with the brake and controlling the brake.

In accordance with yet again an added feature of the invention, a change magazine is provided for automatically exchanging the workpiece carriers.

In view of the fact that simple exchange of the workpiece carriers, too, is possible in the apparatus according to the invention, it is of course possible to provide only as many workpiece carriers as actual working steps to be carried out. That is to say, regions in which there are no workpiece carriers are possible. Here, it has proved to be advantageous if at least one fixed sensor element is provided for detecting the workpiece carriers, which are moved past it, the operation of the processing modules and/or of the feeders being controlled as a function of the result of the detection. This control may be such that, if a workpiece carrier is detected as missing, its position relative to the working or motional cycle is stored in the control device controlling the working operation of the processing module or respectively the processing unit and/or the feeder or respectively the feeding unit, and, with each motional cycle, the working operation of the processing module or respectively the processing unit and/or the feeder or respectively the feeding unit of the following position to be reached or the position already reached is interrupted. In the process, this is done in such a way that intervention only takes place in the pneumatic motional control of, for example, the gripper or the pincer or else of the feeding unit, and thus the actual working activity is interrupted. The actual sequence of motion of, for example, the processing module, which travels, for example, in the direction of the feeding unit and returns again and which is positively controlled anyway via the common drive, is not interrupted in the process. In this way, a situation is thus achieved in which work is actually only carried out where it is required.

With regard to the exchangeability of, in particular, the workpiece carriers, the problem may sometimes occur that a workpiece carrier is not completely engaged. This workpiece carrier, during the movement of the workpiece carriers, may now collide with a frame part or the like. In the most favorable case, further movement would simply lead to the destruction of the workpiece carrier. In order to prevent that, a safety coupling may be provided according to the invention in the drive line between the drive and the motion device for the workpiece carriers, and this safety coupling, if required, in particular if a preset torque is exceeded, disconnects the drive line, a brake being arranged downstream of this safety coupling, and this brake locks the motion device when the safety coupling is disconnected. In this case, a further sensor element which continuously detects the position of a movable part of the safety coupling and is in control connection with the electromagnetic brake may be provided, the brake being controlled as a function of the result of the detection. That is to say, the brake is automatically released when the movable part is again in the correct position permitting faultless working operation. Finally, it has proved to be advantageous if, according to the invention, a change magazine automatically exchanging the workpiece carriers is provided, this change magazine being arranged in a suitable position on the frame and automatically exchanging the "old" workpiece carriers for the "new" workpiece carriers.

With the above and other objects in view there is also provided a workpiece carrier for the above-described apparatus. A first part is thereby disposed on the apparatus and a second part is detachably connectible to the first part via a push-in/latching connection.

In that case, there may be provided a pin receptacle, a latch pin, and an actuating element for actuating the pin receptacle or the latch pin on the second part, and wherein the first part is provided with a respective counterpart to the pin receptacle or latch pin to be brought into operative connection with the pin receptacle or the latch pin. The actuating element is preferably a press bolt movable manually against a restoring force.

In accordance with a preferred embodiment, the first part and the second part are respective counterparts together forming a dovetail connection.

The forgoing clamping connectors may also be provided similarly in the context of processing module, a processing unit, a feeder, and a feeding unit.

Therefore, in addition to the production and assembly apparatus itself, the invention also relates to a workpiece carrier, a processing module and a feeder for the apparatus according to the invention. These are in each case distinguished by the fact that a second part is provided on them, and this second part, with a push-in/latching connection being formed, can be detachably connected to a first part provided on the production and/or assembly apparatus.

With the above and other objects in view there is also provided, in accordance with the invention, a processing unit for a processing module according to the invention as well as to a feeding unit for a feeder according to the invention. These, too, according to the invention, are distinguished by the fact that a second part is provided in each case, and this second part, with a push-in/latching connection being formed, can be detachably connected to a first part provided on the processing module or respectively on the feeder.

Furthermore, the invention comprises an interchangeable fastening device for the detachable fastening of a workpiece carrier and/or a processing module and/or a feeder to a production and/or assembly apparatus, or for fastening a working or feeding unit to a processing module or a feeder of a production and/or assembly apparatus. According to the invention, the interchangeable fastening device is distinguished by the fact that it is designed as a push-in/latching connection having a first part and a second part, comprising a latch pin, which is provided on one part and is movable by means of a press bolt movable against a restoring force, and a pin receptacle, which is provided on the other part, the motional coupling between press bolt and latch pin being formed by means of a bearing pin, which is provided on the latch pin and engages in a guide groove formed on the press bolt, or by means of a toggle lever, which is mounted on the press bolt via a bearing pin and whose ends are mounted on the respective part and on the latch pin respectively, the connection preferably being a self-locking dovetail connection.

Finally, the invention also relates to a production and/or assembly apparatus system, comprising a frame, which forms a standardized basic unit and has a motion unit movable relative to this frame, and a plurality of workpiece carriers and/or processing modules and/or processing units and/or feeders and/or feeding units, which are designed to be different in their type and/or function, in which case, by means of interchangeable fastening devices, the workpiece carriers can be detachably fastened to the motion unit, the processing modules and the feeders can be detachably fixed to the frame, and the processing units can be detachably fixed to the processing modules, and the feeding units can be detachably fixed to the feeders, each interchangeable fastening device comprising a first part, which is fixed to the motion unit or the frame or the processing module or the feeder respectively, and a second part, which is provided on each workpiece carrier or processing module or each feeder or processing unit or feeding unit respectively, and the second parts of all the workpiece carriers or processing modules or feeders or processing units or feeding units respectively being of identical design in each case, so that they can be fastened to any assigned first part. This part of the invention thus provides a complete interchangeable system, which permits the resetting of an existing apparatus in any form.

Other features which are considered as characteristic for the invention are set forth in the appended claims.

Although the invention is illustrated and described herein as embodied in a production and/or assembly apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
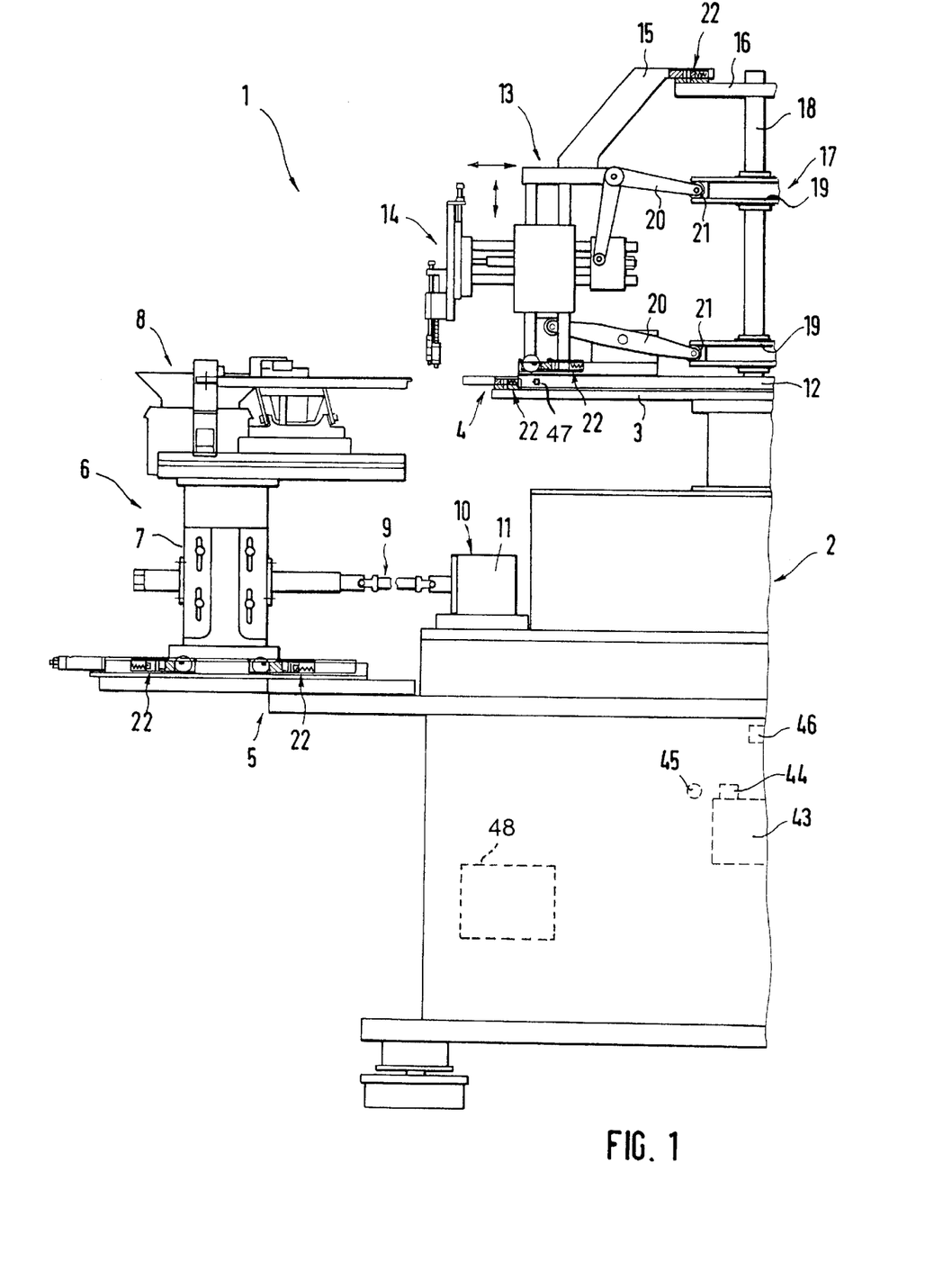
FIG. 1 is a partly sectional, partly elevational, partial view of a production and/or assembly apparatus according to the invention implemented as a rotary indexing installation.
Figure 5:
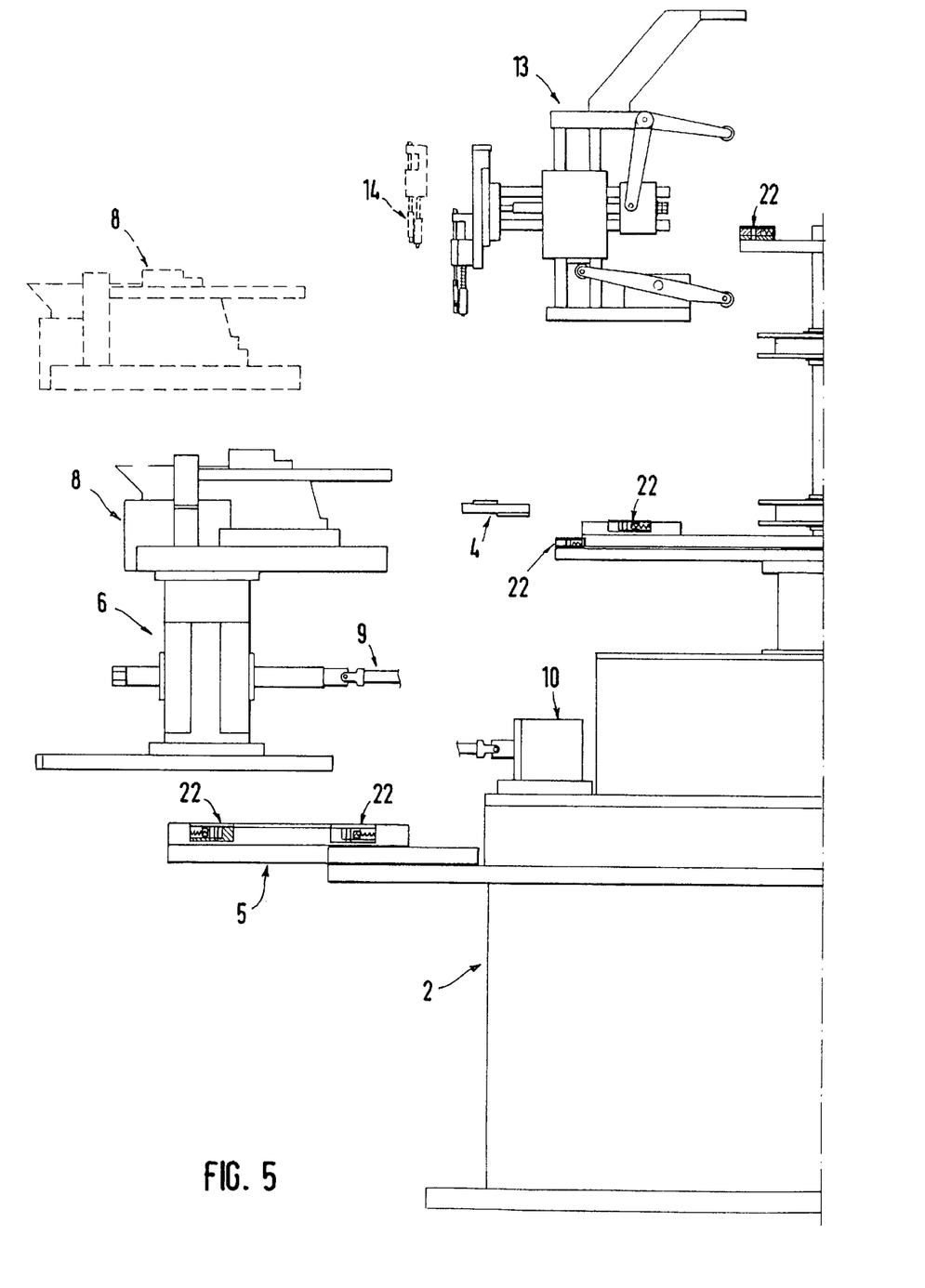
FIG. 5 is an exploded view of the apparatus of FIG. 1.

Referring now to the figures of the drawing in detail and first, particularly, to the partial illustration in FIGS. 1 and 5 thereof, there is seen a production and/or assembly apparatus according to the invention. The production and/or assembly apparatus, in the following also referred to as a processing apparatus, consists of a machine frame 2, which forms a standardized basic unit and on which a rotary indexing table forming a motion device 3 is arranged in an integrated manner. A plurality of workpiece carriers 4 are arranged at the margin on the rotary table. The table 3 is driven in a rotary manner via a non-illustrated motor-operated drive, for instance in the form of a cam-plate drive, arranged in the bottom part of the frame 2. The production/assembly of the respective workpiece is effected on or respectively in these workpiece carriers 4. In order to permit this, a plurality of feeders 6, consisting of a base part 7 and a feeding unit 8, are provided in a fixed position on a mounting fixture 5 provided on the frame 2. With such a feeder, it is possible for the components which are to be used at the workpiece carrier 4 to be placed in the appropriate position required for further processing. These feeders may be a conveying device, for example, as in the exemplary embodiment shown.

Similarly, they may be designed as a stacking unit or as a punching device for punching out the components from a punching strip. In the exemplary embodiment, the feeder 6 is coupled by means of a releasable drive connection 9 to a drive coupling 10 in the form of a bevel gear unit 11, which is in drive connection with the drive system in the frame 2. The feeding unit 8, which in the example shown delivers the articles to the receiving position from a receptacle accommodating a multiplicity of the same, is driven in this way.

A processing module or working module 13, on which a processing unit or working unit 14, a gripper in the illustrated example, is arranged, is provided on a mounting table 12 arranged on the frame 2 and located above the rotary table. By means of this movable gripper (cf. the two double arrows), it is possible to pick up the delivered article in the region of the receiving position at the feeding unit 8, to deliver it to the workpiece carrier 4 and to use it there. Instead of the processing module 13, which permits handling of components, the processing module may also be designed as a screwdriving, soldering or welding device, which in that case, of course, need not necessarily be assigned a feeder 6. An implementation as a pressing or embossing device is also possible. No limits whatsoever are set here. The processing module 13, as described, is arranged at the base on the mounting table 12. Furthermore, the processing module 13, by means of a support 15, is fastened to a top 16 provided on the frame. This results in a robust arrangement.

The movement of the processing module 13 together with the processing unit 14 in the x and y directions is effected by means of a drive device 17. In the illustrated example, the latter consists of a stroke rod 18 that is coupled to the non-illustrated motor-operated drive and that can be moved in the vertical direction. In the example, two coupling receptacles 19 in the form of stroke plates are arranged on the stroke rod 18 and are vertically movable. Coupling elements 21 arranged on the processing module 13 via levers 20 are movably and detachably accommodated in these coupling receptacles. If the stroke rod 18 together with the coupling receptacle 19 now moves vertically, this leads to the processing module 13, and thus also the processing unit 14, being moved vertically and horizontally as a result of the corresponding lever arrangement on the processing module 13. The actual working control of the processing unit 14 (as well as, if need be, of the feeder 6 in a corresponding configuration) is effected via a non-illustrated pneumatic system, which thus serves, for example, to open and close the gripper or the like.

As shown in FIG. 1, the workpiece carrier 4, the feeder 6 and the processing module 13 are detachably secured on the frame 2 and the motion device 3 respectively via interchangeable fastening devices 22, which are described in more detail below. This makes it possible for these components, by simple release of this interchangeable fastening device 22, which is designed as a self-locking push-in/latching connection, to be easily separated from the frame 2 and arranged once more on any appropriate fastening device. As a result of the standardized construction thus far with regard to the fastening of the respective components to the frame, which likewise forms a standardized basic unit, it is also possible in this respect to fix any other processing module or respectively another feeder or another workpiece carrier for the purposes of resetting the apparatus for processing (i.e., producing/assembling) a workpiece of different design. For that purpose the respective component merely needs to be fixed by means of the interchangeable fastening device described below. As also shown in FIG. 5, in which the detachability of the respective components is shown, it is likewise possible (even though not explicitly shown) to mount the feeding unit 8 and the processing unit 14 in a detachable and exchangeable manner, likewise by means of such an interchangeable fastening device, so that, if required, only these components have to be exchanged. The interchangeability is indicated by the feeding unit and processing unit respectively shown by broken lines.

Furthermore, FIG. 1 shows, in principle, a safety coupling 43 integrated in the drive line. It comprises a movable part 44, which changes its position if a certain torque is exceeded. The change is detected by a sensor element 45. The latter controls an electromagnetic brake 46, which engages immediately and prevents further movement.

One or several fixed sensor elements 47 are provided for detecting a workpiece carrier within its work cycle track. The operation of the individual modules and/or of the feeder 6 is controlled in dependence on the results obtained from signals issued by the sensor elements 47. For that purpose, the sensor elements 47 are connected to a main electronic control unit 48 which controls the operation and the work cycles of the modules, and of the entire apparatus.

Figures 2, 3:
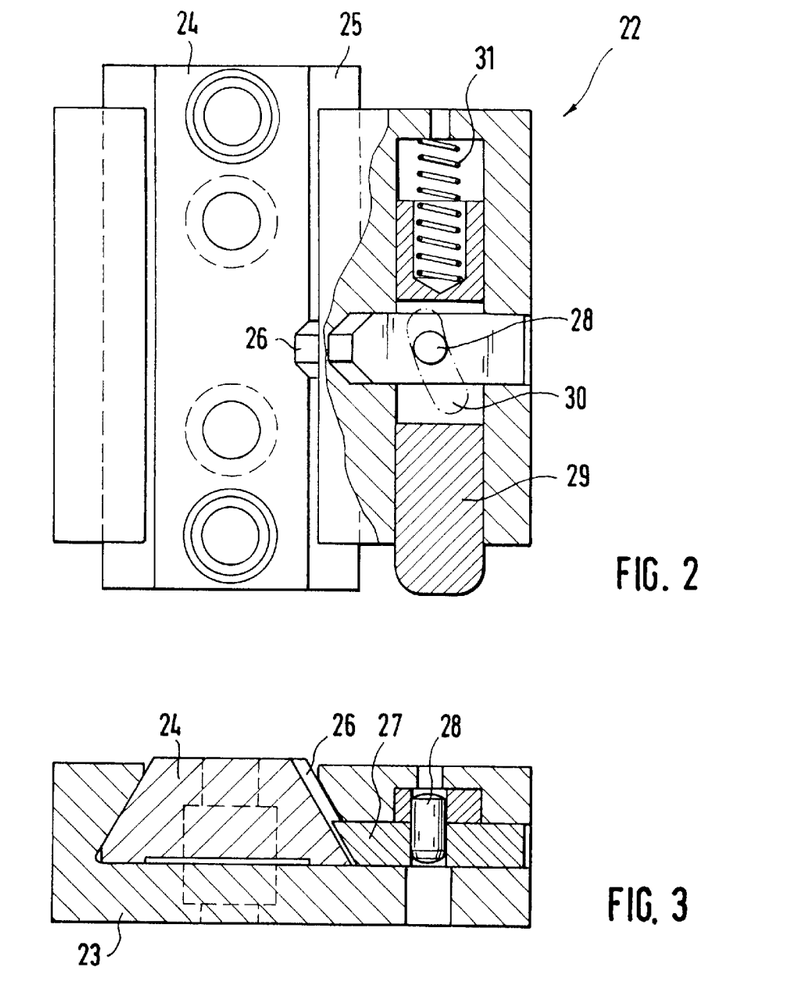
FIG. 2 is a partly broken-away plan view of a fastening device.
FIG. 3 is a cross-sectional view through the device of FIG. 2.
Figure 4:
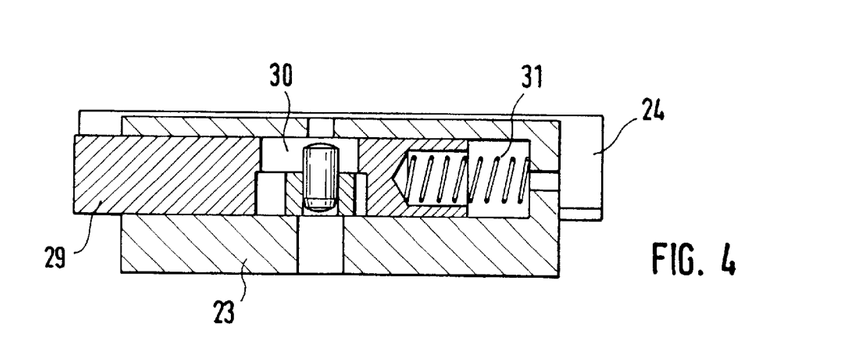
FIG. 4 is a longitudinal section through the device of FIG. 2.

An interchangeable fastening device according to the invention is shown in FIGS. 2 to 4, which illustrates the basic principle as used in this respect in all the detachable components of the apparatus. The interchangeable fastening device 22 includes a first part 23, which is arranged on the frame or respectively on the motion device or respectively, if required, on the feeder or the processing module. A second part 24, which is arranged on the respective component, is to be inserted into the first part 23. This is shown by way of example in FIGS. 2 to 4. Both parts 23, 24 together form a dovetail connection, as can be seen in particular from FIG. 3. A pin receptacle 26 is formed in the inclined surface 25 of the second part 24. A movable latch pin 27, which is arranged on the first part 23, can engage in the receptacle 26. The latch pin 27 has a bearing pin 28, which engages in a guide groove 30 formed on an actuating element in the form of a press bolt 29. The press bolt 29 is mounted so as to be movable against a spring 31. To move the latch pin 27 into and out of engagement with the pin receptacle 26, the press bolt 29 is to be actuated accordingly. If the press bolt 29 is actuated when the latch pin is engaged (in accordance with the position in FIG. 2), the bearing pin 28 shifts in the guide groove as a result of the displacement of the guide groove 30. The latter is slightly curved, which results in the latch pin being displaced at right angles to the direction of movement of the press bolt and being disengaged from the latch receptacle 26. The spring force of the spring 31, which is compressed in the process, pushes the press bolt 29 back into the initial position after releasing the counterforce. This results in the latch pin 27 also being pushed in the direction of the second part 24. In this case, the guide groove 30 in combination with the bearing pin 28 is arranged and designed in such a way that self-locking fastening is achieved, since it is not possible in this respect for the latch pin to shift unintentionally out of its engaged position without actuating the press bolt 29, since the guide groove 30 provides such an abutment for the bearing pin 28 that displacement is not possible without actuating the press bolt.

If one of the components of the apparatus is now to be exchanged, the latching connection is merely released by actuating the press bolt 29, whereupon the part to be exchanged in each case can simply be pulled out of the latching connection. In the same way, the new component is inserted in the most simple manner by pushing the second part 24 into the first part 23 and is displaced until the two latch elements come into engagement with one another. In this case, it may be pointed out that the first part 23, which is in one piece in the example shown, may equally be designed in two pieces in such a way that the sections of the first part 23 which produce the dovetail guide are separate guide angles or guide rails. As already explained, such an interchangeable fastening device is used at the locations shown in FIG. 1.

Figures 6, 7:
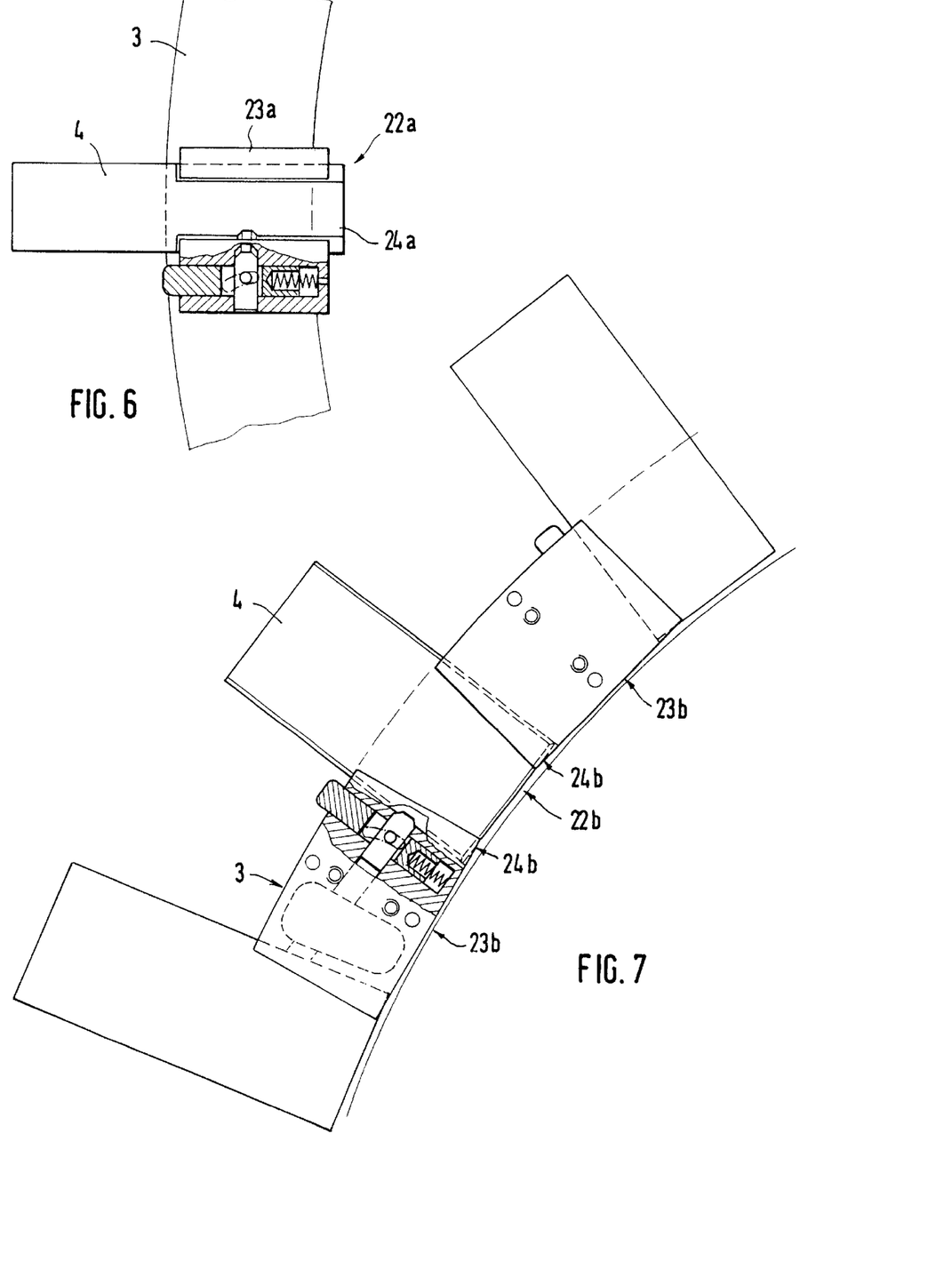
FIG. 6 is a partly broken-away plan view of a workpiece carrier disposed on a motion device and a first embodiment of an fastening device.
FIG. 7 is a partly broken-away plan view of a workpiece carrier disposed on a motion device and a second embodiment of an fastening device.

FIGS. 6 and 7 show two examples of how the interchangeable fastening device may be configured in the region of the workpiece carriers. FIG. 6 shows a first embodiment, wherein a separate interchangeable fastening device 22a is assigned to each workpiece carrier 4. The interchangeable fastening device 22a is constructed as described with regard to FIGS. 2 to 4. The inclined surfaces of the two parts 23a, 24a run essentially rectilinearly, the first part 23a being a one piece part here.

The modification (22b) according to FIG. 7 is different. There, the first parts 23b arranged on the motion device 3 are correspondingly longer. Each side edge forms a guide surface for the dovetail connection. In other words, two first parts 23b arranged side by side form in each case the guide surfaces facing one another. The workpiece carrier 4 is to be pushed in between these two parts 23b until it accordingly interlocks. In this case, the design of the dovetail connection narrows in the direction of the push-in end of the workpiece carrier; that is to say, a push-in limit is also realized insofar as the two bearing surfaces of the parts 23b, 24b meet when the workpiece carrier is pushed in to a sufficient depth and, like a press fit, prevent further pushing-in.

Figure 8:
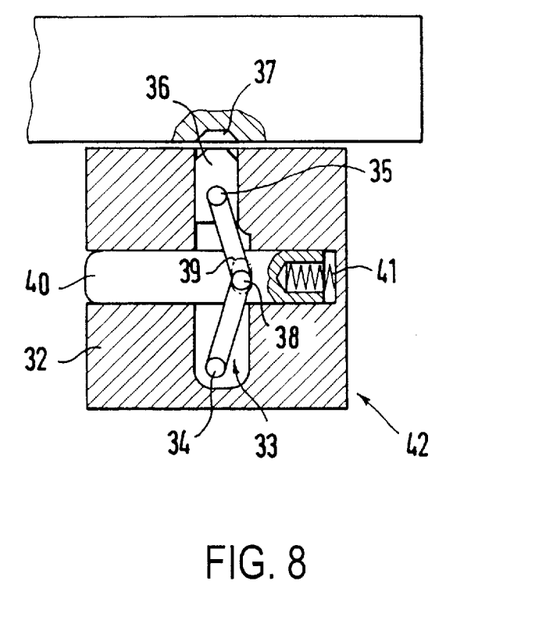
FIG. 8 is a diagrammatic sketch of a self-locking fastening device in a first, open position.
Figure 9:
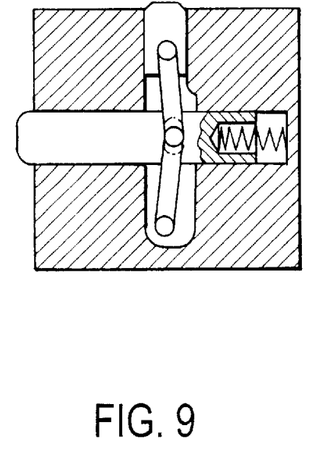
FIG. 9 is a similar view thereof in a second, locking position.

Finally, FIGS. 8 and 9 illustrate a second embodiment of a self-locking interchangeable fastening device 42 according to the invention. In this interchangeable fastening device 42, a toggle-lever connection is used on the first part 32. The toggle-lever connection consists of a toggle lever 33, one end 34 of which is fastened in an articulated manner to the first part 32 and the other end 35 of which is fastened in an articulated manner to the latch pin 36, which here, too, engages in a corresponding latch receptacle 37 of an element to be inserted. The toggle lever is mounted centrally by means of a bearing pin 38 in an aperture 39 of the press bolt 40, which here, too, is movable against a spring 41. The mode of operation is such that, when the press bolt 40 is pressed (starting from the position shown in FIG. 9), the two arms of the toggle lever 33 are pivoted about the bearing pin 38, which leads to the latch pin 36 being pulled slightly inward, the bearing pin 38 being slightly movable in the aperture 39 for this purpose. The sequence of motion is reversed when the press bolt 40 is relieved.

According to the above explanations, the system according to the invention, on the one hand, is based on the use of a quick-change fastening device which is simple to operate and, on the other hand, is based on the fact that the quick-change fastening device is constructed so as to be identical and standardized for the respective type of component which is detachably mounted on the frame or respectively the motion device or else on the feeder or the processing module. In other words, a new element likewise has the fastening component specific to the element, and the fastening component is compatible with the complementary fastening part on the frame, etc. In this way, any resetting and retooling of the modular system is possible in a simple manner.

I claim:

1. An assembly apparatus, comprising:
   a frame;
   a motion device mounted on said frame;
   first push-in/latching connectors having a first part disposed on said motion device and a second part disposed on workpiece carriers for interchangeably and detachably mounting in an indexed manner said workpiece carriers on said motion device;
   second push-in/latching connectors having a first part disposed on said frame and a second part disposed on processing modules for interchangeably and detachably mounting in an indexed manner said processing modules on said frame;
   third push-in/latching connectors having a first part disposed on said frame and a second part disposed on feeders for interchangeably and detachably mounting in an indexed manner said feeders on said frame; and
   a fixed sensor element for detecting a presence of said workpiece carriers, wherein an operation of said processing modules and said feeders is controlled in response to a signal of said sensor element.

2. The apparatus according to claim 1, further comprising: a processing unit at a respective one of said processing modules and a feeding unit at a respective one of said feeders, and wherein one of said processing unit is detachably and interchangeably mounted by one of said second push-in/latching connectors and said feeding unit is detachably and interchangeably mounted by one of said third push-in/latching connectors.

3. The apparatus according to claim 1, wherein any one of said first push-in/latching connectors, second push-in/latching connectors, and third push-in/latching connectors, are dovetail connections.

4. The apparatus according to claim 1, wherein any one of said first push-in/latching connectors, second push-in/latching connectors, and third push-in/latching connectors, are self-locking connections.

5. The apparatus according to claim 1, wherein any one of said first, second and third push-in/latching connectors have a latch pin disposed on one of said respective first and second part and an actuating element for moving said respective latch pin, and the other of said respective first and second part has a pin receptacle formed therein.

6. The apparatus according to claim 5, wherein said actuating element is a press bolt manually actuatable against a restoring force, said latch pin being coupled to said press bolt.

7. The apparatus according to claim 5, which further comprises a bearing pin motionally coupling said latch pin to said bearing pin, said bearing pin engaging in a guide groove formed in said actuating element.

8. The apparatus according to claim 5, which further comprises a toggle lever mounted on said actuating element via a bearing pin, said toggle lever having ends mounted respectively on said latch pin and on said one of said first and second parts.

9. The apparatus according to claim 1, wherein each of said first, second and third push-in/latching connectors is adapted to fasten a respective element in a plurality of fastening positions.

10. The apparatus according to claim 1, which further comprises adjusting means on at least one of said processing modules and said feeders.

11. The apparatus according to claim 10, wherein said adjusting means include an adjusting spindle for moving a latch receptacle.

12. The apparatus according to claim 1, which comprises a common drive for said processing modules and said feeders, at least one part of said processing modules and one part of said feeders being detachably connectible to said common drive.

13. The apparatus according to claim 12, which further comprises a plurality of drive couplings mounted on said frame and assigned to each of said processing modules and said feeders, said processing modules and said feeders being detachably connected to said common drive via said drive couplings.

14. The apparatus according to claim 13, wherein said drive couplings are bevel gear units, and said drive couplings assigned to said processing modules comprise a plurality of coupling receptacles movable by said common drive and coupling elements of said processing modules mounted to said coupling receptacles.

15. The apparatus according to claim 1, which further comprises a drive for driving said motion device and a safety coupling disposed in a drive line between said drive and said motion device, said safety coupling, if a given torque is exceeded, disconnecting said motion-device from said drive, and including a brake disposed so as to brake said motion device when said safety coupling is disconnected.

16. The apparatus according to claim 15, wherein said safety coupling includes a movable part, and a sensor element continuously monitoring a position of said movable part, said sensor element being in control connection with said brake and controlling said brake.

17. An assembly apparatus, comprising:
   a frame;
   a motion unit movably disposed relative to said frame;
   a plurality of functionally different components selected from the group consisting of workpiece carriers, processing modules, and feeders;
   a plurality of fastening devices for releasably fastening said components to a respective one of said motion unit and said frame, each of said fastening devices including:

a first part mounted on a respective one of said motion unit and said frame;

a second part mounted on a respective one of said components; wherein each second part of said plurality of fastening devices is identical and being interchangeably connectible with each first part of said plurality of fastening devices;

a fixed sensor element for detecting a presence of said workpiece carriers, wherein an operation of said processing modules and said feeders is controlled in response to a signal of said sensor element;

and an electronic control device controlling an operation of the apparatus, said control device being programmed to, if one of said workpiece carriers is detected as being missing, store a position thereof relative to a defined work cycle in memory, and, with each motional cycle, interrupt a working operation of a respective one of said processing module and said feeder.

* * * * *